(12) United States Patent
Hsiao et al.

(10) Patent No.: US 7,588,450 B2
(45) Date of Patent: Sep. 15, 2009

(54) SOCKET

(75) Inventors: Shih-Wei Hsiao, Tu-Cheng (TW); Andrew Gattuso, Chandler, AZ (US); Ke-Hao Chen, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/897,150

(22) Filed: Aug. 29, 2007

(65) Prior Publication Data
US 2008/0057765 A1 Mar. 6, 2008

(51) Int. Cl.
*H01R 13/15* (2006.01)
(52) U.S. Cl. .................................... 439/259
(58) Field of Classification Search ............... 439/259, 439/266, 33, 68, 72, 73, 264, 152, 525, 372, 439/101
See application file for complete search history.

(56) References Cited

U.S. PATENT DOCUMENTS

| 4,717,346 | A | * | 1/1988 | Yoshizaki | ...................... 439/71 |
| 5,939,891 | A | * | 8/1999 | Kishi et al. | .................. 324/755 |
| 6,276,950 | B1 | * | 8/2001 | Yodogawa | .................... 439/160 |
| 2003/0045148 | A1 | * | 3/2003 | Watanabe | .................... 439/266 |
| 2004/0192095 | A1 | * | 9/2004 | Joist | ............................ 439/188 |

* cited by examiner

*Primary Examiner*—Edwin A. Leon
(74) *Attorney, Agent, or Firm*—Wei Te Chung

(57) ABSTRACT

A socket, for receiving a semiconductor package, has an insulating base receiving a plurality of contacts, a plurality of movable arms, a first movable frame, a second movable frame and a plurality of springs urging the movable arms. Each movable arm defines am opening position and a close position relative to the insulating base, The movable arm has an actuating portion with a free end and a cuneiform outside surface, a horizontal portion extending from the actuating portion for pressing the semiconductor package and a pair of bores on a bottom part of the actuating portion. A haulm passes through the bores to assemble the movable arm to the insulating base.

9 Claims, 5 Drawing Sheets

SOCKET

BACKGROUND OF THE INVENTION

1. Field of the Invention

The present invention relates to a socket, which electrically connects a semiconductor package and a circuit board.

2. Description of the Related Art

A socket which is used for easily and quickly connecting a semiconductor package usually can cooperates with an industry mechanism arm in working. For example, a socket has a heat sink and a movable frame. When the movable frame downwardly moves, the heat sink originally horizontally mounted on the socket is brought to upwardly move from a center part of the socket to let the mechanism arm quickly and accurately position the semiconductor package on the socket. After assembling the semiconductor package, the movable frame moves upwardly to an original position by resilience force of a plurality of springs, during this process, another plurality of springs force the heat sink to move downwardly to original position and latch with the semiconductor package to keep the semiconductor in the socket.

However, for a conventional socket, when the movable frame upwardly moves, a moment, which is occurred by the force transferred by resilience force of the springs and effects on the heat sink to bring the heat sink to rotate to a horizontal state, is very small, that may cause the heat sink can not reliably latch the semiconductor package. Sometimes, enhancing elastic coefficient of the springs may increase the moment, but, on that case, a driving force effected on the movable frame requires to be added, nevertheless, the driving force is provided by a pressure equipment which has a power floating in a certain range, so the elastic coefficient of springs can not be too big, otherwise, the movable frame may not downwardly move for not enough force provided by the pressure equipment.

Hence, an improved socket is required to overcome the disadvantages of the prior art.

SUMMARY OF THE INVENTION

An object of the invention is to provide a socket, in which a semiconductor is reliably kept.

To achieve the above-mentioned object, a socket comprises an insulating base receiving a plurality of contacts; and at least one movable arm pivotally assembled to the insulating base, each movable arm having an actuating portion with a free end and a horizontal portion extending from the actuating portion, the actuating portion being formed with a cuneiform outside surface.

Other features and advantages of the present invention will become more apparent to those skilled in the art upon examination of the following drawings and detailed description of preferred embodiments, in which:

DETAILED DESCRIPTION OF PREFERRED EMBODIMENT

Reference will now be made in detail to the preferred embodiment of the present invention.

Figure 1:
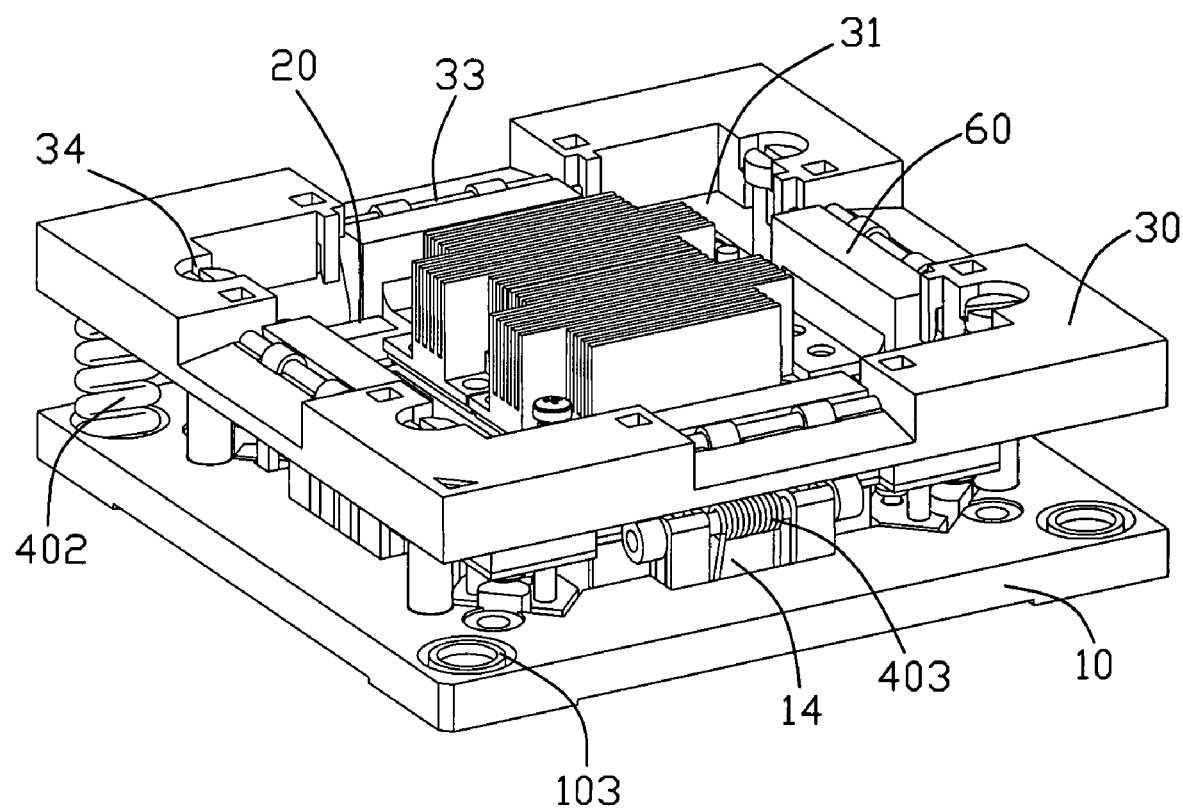
FIG. 1 is an assembled, perspective view of a socket in accordance with a preferred embodiment of the present invention.
Figure 2:
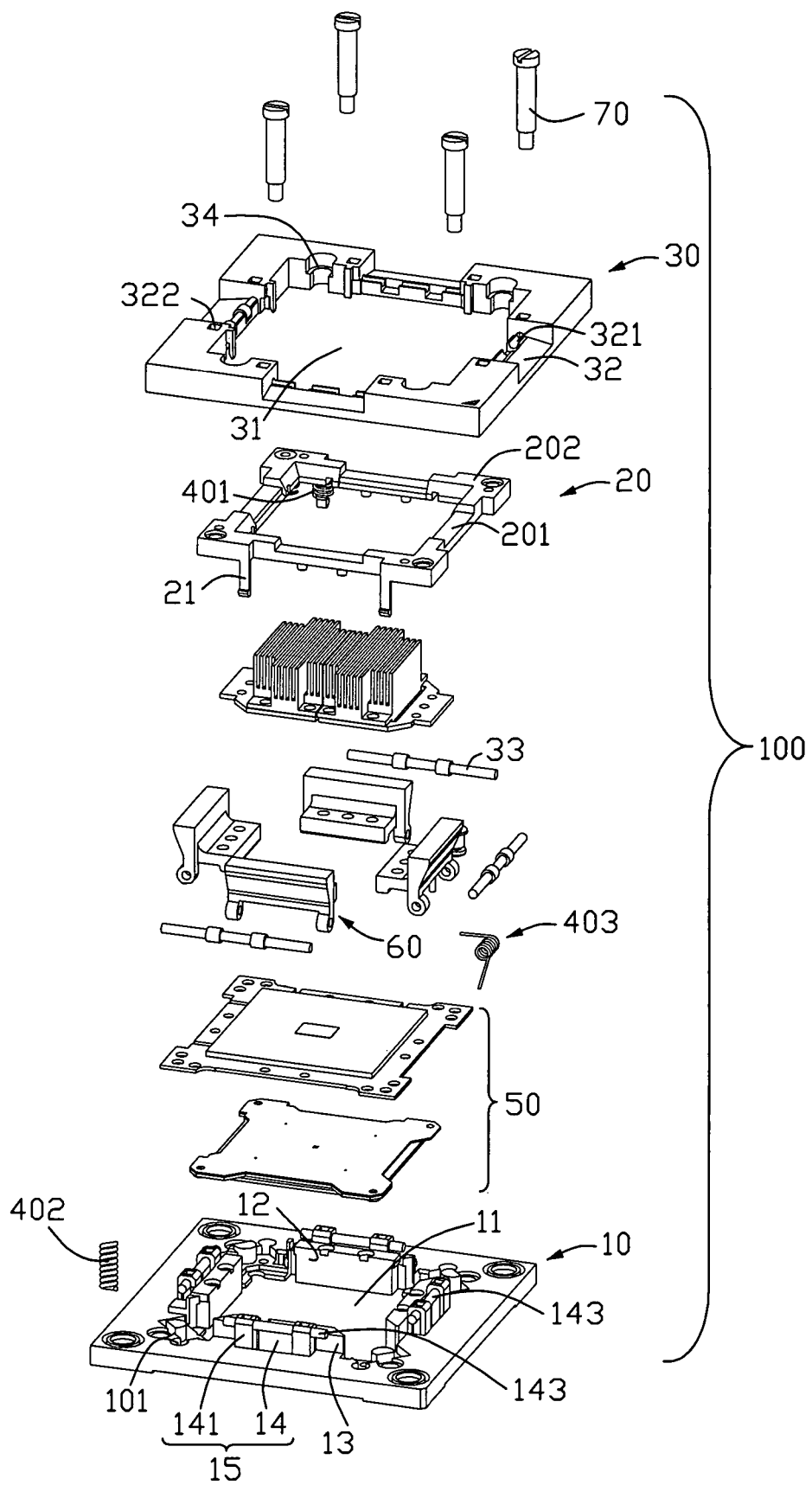
FIG. 2 is an exploded, perspective view of a socket in FIG. 1.

Referring to FIGS. 1-2, a socket 100 in accordance with the preferred embodiment of the present invention is adapted to electrically connect a semiconductor package (not shown) to a circuit board (not shown). The socket 100 comprises an insulating base 10, a first movable frame portion 20 and a second movable frame 30 mounted to the insulating base 10, a plurality of springs, a clapboard 50 located in a center of the socket 100 for receiving contacts (not shown), four movable arms 60 respectively assembled to the insulating base 10 and a heat sink (not labeled).

The insulating base 10 has a rectangular shape and defines a quadrate opening 11. The insulating base 10 has four trapezium blockings 12 around four edges of the opening 11, and four rectangular blockings 13 respectively being adjacent to and located outside corresponding trapezium blocking 12. Each rectangular blocking 13 has a slot 14 recessed from a center part of each outside surface thereof and two protruding posts 141 located two lateral side of the slot 14 and defining holes 142 (referring to FIG. 5) at free end thereof, the protruding posts 141 and together with the slot 14 form a seat 15. The movable arm 60 pivotally assembles to the seat 15 by a haulm 143 with a third spring 403 passing through the holes 142. The insulating base 10 further defines a plurality of engaging holes 101 for engaging with blots 70, and four recesses on each corners thereof with a column 103 therein.

The first movable frame 20 has a rectangular configure, and is formed with four flat roofs 201 respectively recessed from a center part of each sidewall thereof and four L-shaped mounting portions 202 at four corners thereof. Four latching claws 21 are divided into 2 groups and extends downwardly from two opposed sides of the first movable frame 20 to latch with the insulating base 10.

The second movable frame 30 is also in a rectangular shape, and defines a hatch 31 in a center part thereof. The second movable frame 30 is formed with four rectangular flat roofs 32 respectively downwardly recessed from a center part of four sidewalls thereof. Each flat roof 32 defines an arc horizontal groove 321 downwardly recessed from a part thereof near the hatch 31, four poles 33 (only showing three ones) are respectively received in the grooves 321. A pair of vertical rectangular slots 322 are defined beside two ends of the groove 321 and communicates with the groove 321 for retaining two ends of the pole 33. Four U-shaped guiding slots 34 are recessed outwardly from two opposed inner side surfaces of the hatch 31 near corners of the second movable frame 30 for engaging with the blot 70.

Referring to FIGS. 1-2, the plurality of springs 40 comprises a plurality of first springs 401 (only showing one in FIG. 2) assembled to the latch claws 21 and located between the first movable frame 20 and the insulating base 10, a plurality of second springs 402 (only showing one) located between the second movable frame 30 and the insulating base 10 and a plurality of the third springs 403 assembled to the haulm 143. The clapboard 50 is an approximate five-layer rectangular board for receiving the contacts.

Figure 3:
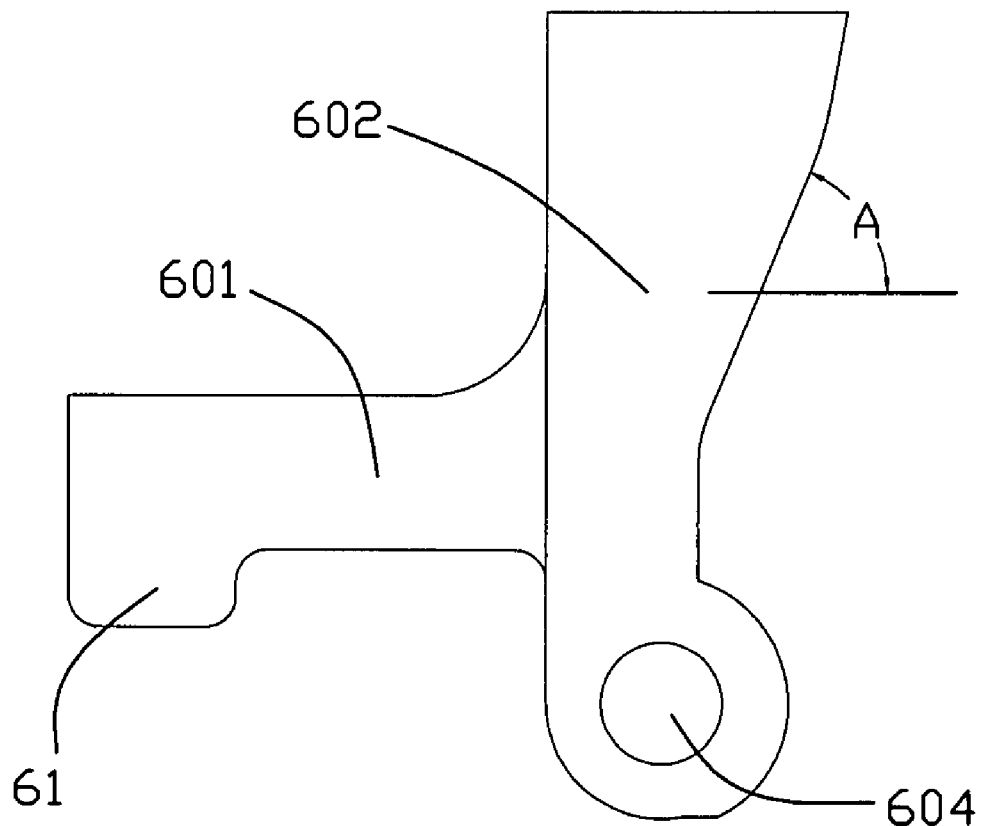
FIG. 3 is a lateral view of a movable arm of the socket.

Referring to FIGS. 2-3, the movable arm 60 is substantial L-shaped and comprise a horizontal portion 601 with a free end and an actuating portion 602. The movable arm 60 defines a pair of bores 604 on a bottom end of the actuating portion 602 for corresponding haulm 143 passing through. The horizontal portion 601 extends from a part of the actuating portion 602 near the bores 604 and has a latching portion 61 protruding downwardly on an end thereof for pressing the semiconductor package (not shown), the actuating portion 602 has a cuneiform outside surface, and an angle defined by the outside surface and a horizontal line I becomes big near the free end of movable arm 60.

Figure 4:
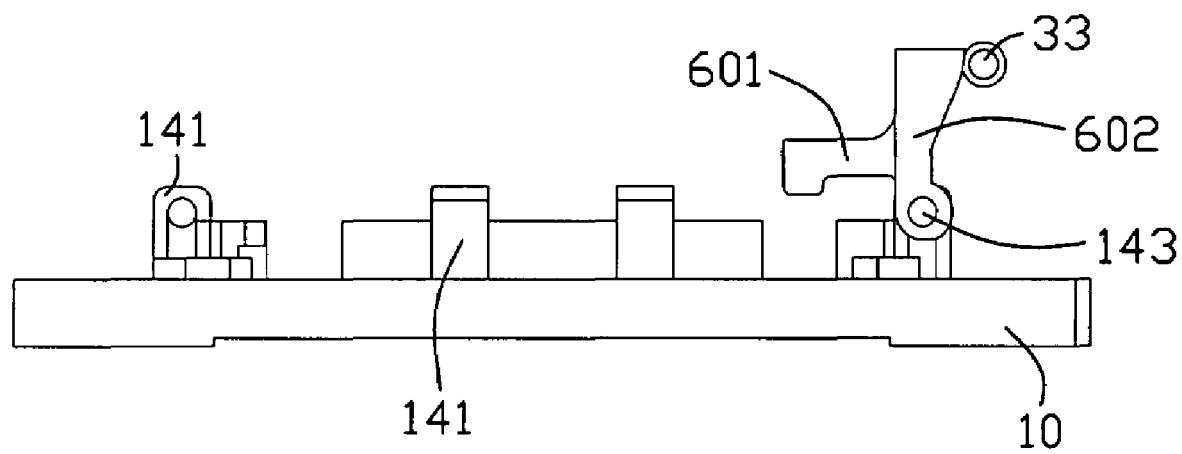
FIG. 4 is a front elevation view of the socket which is partially assembled, wherein the movable arm is at a close position.
Figure 5:
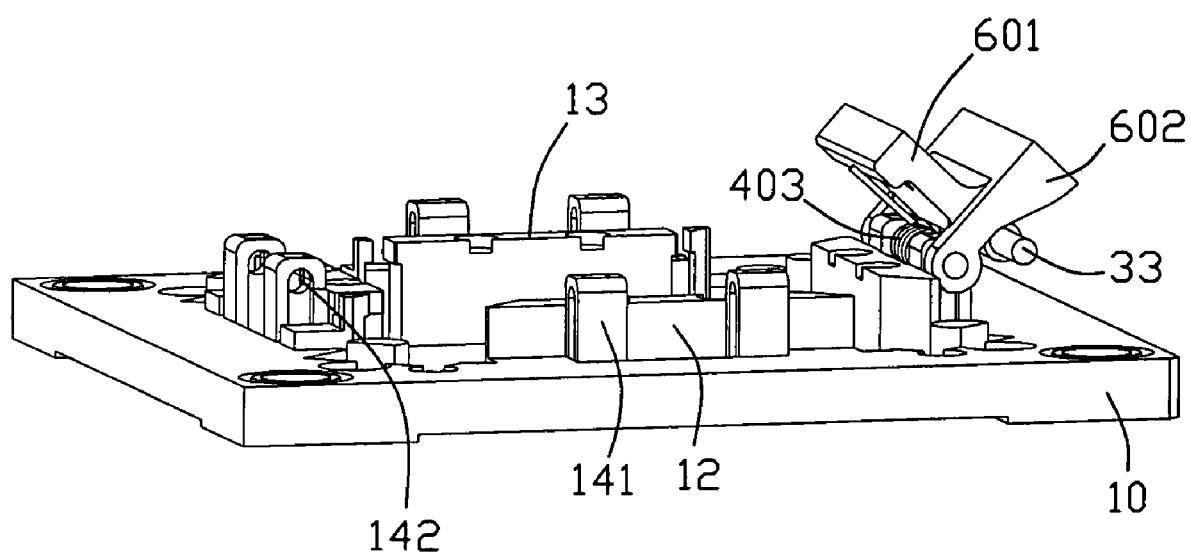
FIG. 5 is a partially, assembled perspective view of the socket, wherein the movable arm is at an opening position.

Referring to FIGS. 4 and 5, and conjoined with FIG. 1-3, when assembly, the movable arms 60 pivotally assemble to the seats 15 of the insulating base 10 by the haulms 143 with the third springs 403 and define an opening position and a close position relative to the insulating base 10, referring to FIG. 5, at this moment, one end of the third spring 403 abuts against a bottom surface of the horizontal portion 601 of the movable arm 60, and the other end of the third spring 403 abuts against a sidewall of the slot 14, so the movable arm 60 is at the opening position and forced by the third spring 403; Then, the clapboard 50 receiving the contacts (not shown) is mounted on the quadrate opening 11 of the insulating base 10; The first movable frame 20 is mounted upon the clapboard 50, the latching claws 21 of the first movable frame 20 is installed with first spring 401 and engages with the insulating base 10, the first springs 401 respectively abut against the insulating base 10 and the first movable frame 20 at two ends thereof.

Finally, the second movable frame 30 assembles to the insulating base 10 by the blots 70 passing through the U-shaped guiding slots 34 of the second movable frame and engaging with the engaging holes 101; the second springs 402 are located between the insulating base 10 and the second movable frame 30 and upwardly push the second movable frame 30 to a high position. the pole 33 received in the groove 321 of the second movable frame 30 abuts against the cuneiform outside surface of the free end of corresponding movable arm 60 (Referring to FIG. 4), so that the movable arm 60 is at the close position, and at this status, the bottom surface of the horizontal portion 601 of the movable arm 60 abuts against the flat roofs 201 of the first movable frame 20.

When using, the second movable frame 30 is actuated by a pressure equipment, the second movable frame 30 together with the pole 33, downwardly move, simultaneity, the second springs 402 located between the second movable frame 30 and the insulating base 10 are compressed, the third springs 403 assembled to the haulm 143 on the seat 15 will force the movable arm 60 to rotate around the haulm 143 to the opening position. When the pressure equipment do not provide force, the second springs 402 will restore to original state, so the second movable frame 30 upwardly moves by the second springs 402, during this process, the pole 33 will move upwardly following the second movable frame 30, and the outside surface of the actuating portion 602 will be forced by the pole 33, the movable arm 60 will rotates to the close position and latch with the semiconductor package (not shown) in the socket 100. Since, there is a far distance between an acting point of the pole 33 on the outside surface of the movable arm 60 and the haulm 143, so if a pressing force provided by the pressure equipment is unchanged, a moment provide by the latching portion 61 on the semiconductor package (not shown) can get a big value to reliably keep the semiconductor package in the socket 100.

While the present invention has been described with reference to preferred embodiments, the description of the invention is illustrative and is not to be construed as limiting the invention. Various of modifications to the present invention can be made to preferred embodiments by those skilled in the art without departing from the true spirit and scope of the invention as defined by the appended claims.

What is claimed is:

1. A socket comprising:
an insulating base receiving a plurality of contacts;
a movable frame assembling to the insulating base and moving up and down relative to the insulating housing;
at least one movable arm pivotally assembled to the insulating base, each movable arm having an actuating portion with a cuneiform outside surface and a horizontal portion extending from the actuating portion, the cuneiform outside surface of the actuating portion being pushed by the movable frame to bring the movable arm pivoting; and
further comprising at least one spring, the movable arm defines an opening position and a close position relative to the insulating base, the spring urges the movable arm to the opening position, wherein
the movable frame actuates the movable arm to rotate from the opening position to the close position by upwardly pushing the cuneiform outside surface of the actuating portion, wherein
the movable frame comprises at least one pole horizontally assembled to a side of the movable frame and moving together with the movable frame, when the movable frame upwardly moves, the pole upwardly pushes the cuneiform outside surface of the actuating portion of the movable arm to rotate the movable arm to the close position, wherein
the movable frame comprise a first movable frame and a second movable frame, the first movable frame is received in and retained to the second movable frame by blots, the pole is assembled to a side of the second movable frame.

2. The socket of claim 1, wherein a bottom surface of the horizontal portion of the movable arm at the close position abuts against the first movable frame.

3. The socket of claim 1, wherein the outside surface gradually becomes sharp toward a free end thereof.

4. The socket of claim 3, wherein the horizontal portion is formed with a downwardly protruding latching portion, the actuating portion defines a pair of bores on a bottom end thereof for engaging with a haulm to assemble the movable arm to the insulating base.

5. The socket of claim 4, wherein the horizontal portion is substantially vertical to the actuating portion and extends from a bottom part of the actuating portion near the bores.

6. A socket comprising:
an insulative base;
a frame mounted on the base and vertically moveable relative to the base between upper and lower positions;
a rotatable arm pivotally mounted on the base and defining an L-shaped configuration with an upstanding actuating portion and a horizontal latching portion; and
a biasing device constantly urging the arm to rotate outward so as to have the horizontal latching portion lifted up and the upstanding actuating portion move downward; wherein
the frame defines a structure engages an upper area of the actuating portion when the frame is moved to the upper position, and said upper area essentially defines a downward wedge shape so as to allow the structure is disengaged from the wedge shape when the frame is moved to the lower position.

7. The socket as claimed in claim 6, wherein said structure is a pole.

8. The socket as claimed in claim 6, wherein a pivot axis of said arm is located below the latching portion when said frame is moved to the upper position.

9. A socket comprising:

an insulating base receiving a plurality of contacts;

at least one movable arm pivotally assembled to the insulating base, each movable arm having an actuating portion with a cuneiform outside surface and a horizontal portion extending from the actuating portion;

further comprising a moveable frame, wherein the movable frame actuates the movable arm to rotate from the opening position to the close position by upwardly pushing the cuneiform outside surface of the actuating portion;

further comprising at least one pole horizontally assembled to a side of the movable frame and moving together with the movable frame, when the movable frame upwardly moves, the pole upwardly pushes the cuneiform outside surface of the actuating portion of the movable arm to rotate the movable arm to the close position;

wherein the movable frame comprise a first movable frame and a second movable frame, the first movable frame is received in and retained to the second movable frame by blots, the pole is assembled to a side of the second movable frame.

* * * * *